United States Patent
Schlesselmann et al.

(10) Patent No.: US 11,092,625 B2
(45) Date of Patent: Aug. 17, 2021

(54) CURRENT SENSING RECOVERY FOR IMAGING SYSTEMS AND METHODS

(71) Applicant: FLIR Commercial Systems, Inc., Goleta, CA (US)

(72) Inventors: John D. Schlesselmann, Goleta, CA (US); Brian B. Simolon, Santa Barbara, CA (US)

(73) Assignee: FLIR COMMERCIAL SYSTEMS, INC., Goleta, CA (US)

(*) Notice: Subject to any disclaimer, the term of this patent is extended or adjusted under 35 U.S.C. 154(b) by 104 days.

(21) Appl. No.: 16/679,042

(22) Filed: Nov. 8, 2019

(65) Prior Publication Data

US 2020/0150160 A1 May 14, 2020

Related U.S. Application Data

(60) Provisional application No. 62/758,032, filed on Nov. 9, 2018.

(51) Int. Cl.
*G01R 19/25* (2006.01)
*G01R 19/00* (2006.01)
*G01R 15/14* (2006.01)
*H04N 5/335* (2011.01)

(52) U.S. Cl.
CPC .......... *G01R 19/25* (2013.01); *G01R 15/148* (2013.01); *G01R 19/0023* (2013.01); *H04N 5/335* (2013.01)

(58) Field of Classification Search
CPC ...... G01J 11/00; G01S 7/4863; G01S 17/894; G01S 17/10; H04N 5/33; H04N 5/378; H04N 5/3745; H04N 5/335; G01R 19/25; G01R 19/0023; G01R 15/148
See application file for complete search history.

(56) References Cited

U.S. PATENT DOCUMENTS

| | | | |
|---|---|---|---|
| 8,581,168 B2 * | 11/2013 | Linder | H04N 5/2256 250/208.1 |
| 9,215,386 B2 * | 12/2015 | Elkind | H04N 5/343 |
| 10,962,420 B2 * | 3/2021 | Simolon | H04N 5/33 |
| 2020/0186712 A1 * | 6/2020 | Hogasten | H04N 5/3651 |
| 2020/0186736 A1 * | 6/2020 | Cannata | H04N 5/378 |

* cited by examiner

*Primary Examiner* — Vinh P Nguyen
(74) *Attorney, Agent, or Firm* — Haynes and Boone, LLP

(57) ABSTRACT

Techniques are provided to facilitate current sensing recovery for imaging systems and methods. In one example, a device includes a detector configured to detect electromagnetic radiation and generate a detection signal based on the detected electromagnetic radiation. The device further includes a current sensing circuit configured to provide, based on the detection signal, a first signal. The device further includes a signal generator configured to provide a second signal to adjust a bandwidth associated with the current sensing circuit. The device further includes an imaging integration circuit configured to generate an image of at least a portion of a scene based at least in part on the first signal. Related methods and systems are also provided.

21 Claims, 8 Drawing Sheets

US 11,092,625 B2

CURRENT SENSING RECOVERY FOR IMAGING SYSTEMS AND METHODS

CROSS-REFERENCE TO RELATED APPLICATIONS

This application claims the benefit of and priority to U.S. Provisional Patent Application No. 62/758,032 filed Nov. 9, 2018 and entitled "CURRENT SENSING RECOVERY FOR IMAGING SYSTEMS AND METHODS," which is incorporated herein by reference in its entirety.

TECHNICAL FIELD

One or more embodiments relate generally to imaging systems and more particularly, for example, to current sensing recovery for imaging systems and methods.

BACKGROUND

Imaging systems may include an array of detectors, with each detector functioning as a pixel to produce a portion of a two-dimensional image. In some cases, such as for infrared imaging, readout of image data captured by the detectors may be performed in a time-multiplexed manner by a readout integrated circuit (ROIC).

SUMMARY

In one or more embodiments, a device includes a detector configured to detect electromagnetic radiation and generate a detection signal based on the detected electromagnetic radiation. The device further includes a current sensing circuit configured to provide, based on the detection signal, a first signal. The device further includes a signal generator configured to provide a second signal to adjust a bandwidth associated with the current sensing circuit. The device further includes an imaging integration circuit configured to generate an image of at least a portion of a scene based at least in part on the first signal.

In one or more embodiments, a method includes capturing, by a detector, electromagnetic radiation. The method further includes generating, by the detector, a detection signal based on the electromagnetic radiation. The method further includes providing, by a current sensing circuit, a first signal based on the detection signal. The method further includes generating, by an imaging integration circuit, an image of at least a portion of a scene based at least in part on the first signal. The method further includes providing, by a signal generator, a second signal to adjust a bandwidth associated with the current sensing circuit.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
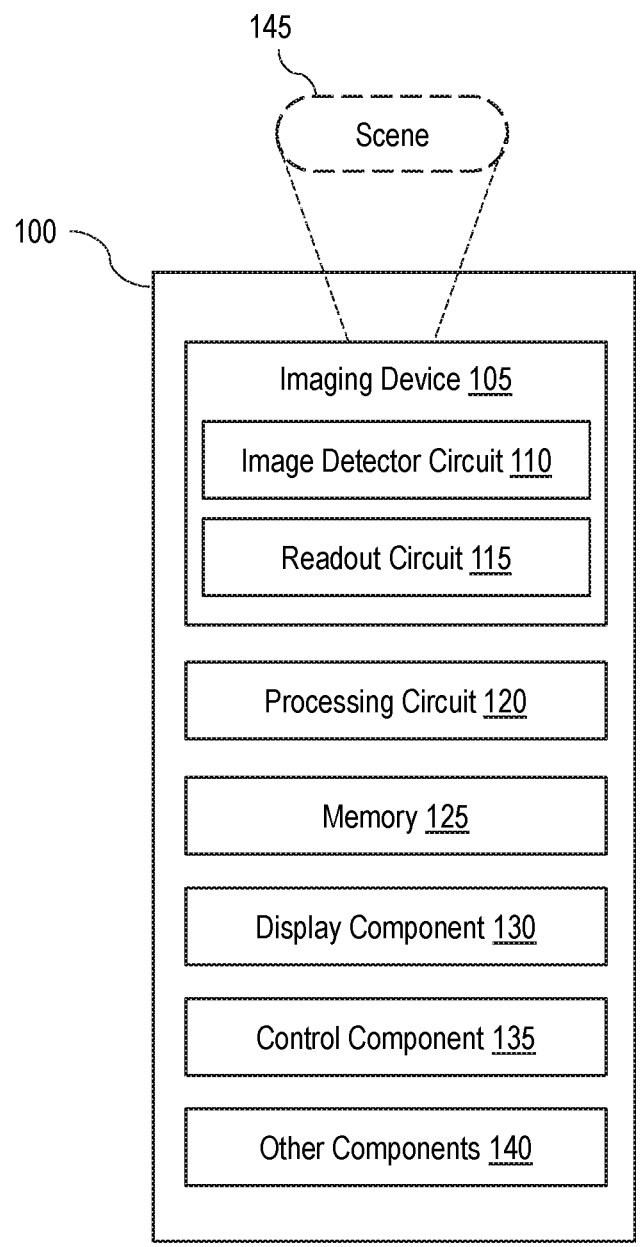
FIG. 1 illustrates a block diagram of an example imaging system in accordance with one or more embodiments of the present disclosure.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims.

In some embodiments, techniques are provided for facilitating current sensing recovery for imaging systems and associated methods. An imaging system may include an array of unit cells, where each unit cell has a detector to generate a detection signal based on detected electromagnetic (EM) radiation (e.g., of a scene), a current sensing circuit to receive the detection signal from the detector and generate a signal based on the detection signal, and an imaging integration circuit configured to generate an image based on the signal from the current sensing circuit. In some embodiments, a bandwidth (and equivalently a recovery time) associated with the current sensing circuit may be a function of a detection signal (e.g., detector current INET) generated by the detector. The bandwidth of the current sensing circuit is inversely related to the recovery time associated with the current sensing circuit, such that higher bandwidth is associated with shorter recovery time and lower bandwidth is associated with longer recovery time.

For a given unit cell, a signal generator may be utilized to generate a signal (e.g., a stimulus) and provide the signal to adjust the bandwidth associated with the current sensing circuit. The stimulus may be a pulsed signal provided outside of an integration period associated with the unit cell to minimize effect of the stimulus on the integration period associated with the unit cell. In some cases, the signal may be a current $I_{PULSE}$. The current $I_{PULSE}$ may be provided as pulsed signals of magnitude $I_{MAG}$. In one aspect, injecting of the current $I_{PULSE}$ for a time $T_{PULSE}$ corresponds to injecting of a charge in the amount of $I_{PULSE}T_{PULSE}$ to a detector node. In some aspects, the signal from the signal generator may be applied in order to mitigate effects of large amplitude, short duration detection signals (e.g., detector current signals) generated by the detector. For example, the detector current $I_{DET}$ and the current $I_{PULSE}$ may be provided in parallel to the current sensing circuit. In some cases, the signal generator may be provided on a per-unit cell basis. In other cases, one or more signal generators may be utilized to provide stimuli, with each signal generator providing stimuli to one or more unit cells of the array.

By applying (e.g., injecting) the signal from the signal generator into the current sensing circuit, the signal generator mitigates an effect of the detection signal on the bandwidth of the current sensing circuit to facilitate meeting of a recovery time criterion for a unit cell. Without the signal provided by the signal generator, for a duration that a large amplitude, short duration detection signal is received by the signal generator from the detector, a bandwidth of the current sensing circuit may increase quickly as a function of the increased detection signal generated by the detector and thus transition the current sensing circuit to a higher bandwidth state that can meet a recovery time criterion (e.g., 1 μs or other desired recovery time criterion). When the duration ends, the bandwidth of the current sensing circuit may decrease quickly as a function of the reduced level of the detection signal and thus transition the current sensing circuit to a lower bandwidth state that may be insufficient to allow recovery (e.g., full recovery) within the recovery time criterion. In this regard, in the lower bandwidth state, the response time to return the current sensing circuit to its desired operating condition may exceed the recovery time criterion. As such, in various embodiments, the signal generator is utilized to shorten the recovery time and may thus be referred to as a detector recovery circuit.

In some embodiments, techniques described herein may be utilized in applications involving active laser pulse detection. Such applications may include a system that transmits a pulse signal (e.g., a short duration laser signal) that goes through an optical path that is also used for detection of scene imagery and a return signal(s) associated with the pulse signal. In some cases, a pulse signal can cause reflections within the system (e.g., optical components of the system) and/or near field reflections from objects that may be closer to the unit cells than a desired object to be imaged. Reflected signals may include backscattered signals. In some aspects, such reflections received by a detector of one or more unit cells may cause the detector to generate large amplitude, short duration detection signals. In some cases, such reflections may be shunted away during a reset period associated with the detectors to minimize or eliminate effects of the reflections on results of an integration period. The recovery time may be, or may be indicative of, an amount of time to exit the reset period and initiate an integration period. In an embodiment, stimuli generated by one or more signal generators to the unit cells of the array may act as an artificial background used to bury effects of the reflections. In some cases, the stimuli can allow faster recovery than the high bandwidth state of the current sensing circuit in the case without the stimuli having been applied. In some cases, the stimuli may have a generally small effect on results of the integration period. In a case that the stimuli have an effect, such an effect is generally a priori predictable and can be calibrated out (e.g., using an offset term(s)). In some cases, a determination may be made as to whether to generate the stimuli and apply the stimuli to one or more of the unit cells. For example, the determination may be made based on a time at which a pulse signal is transmitted (e.g., as part of an active laser pulse application) and/or a time of an expected return pulse signal(s) (e.g., desired and/or unwanted pulse signal(s)).

FIG. 1 illustrates a block diagram of an example imaging system 100 (e.g., an infrared imaging system) in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The imaging system 100 includes an imaging device 105, a processing circuit 120, memory 125, a display component 130, a control component 135, and/or other components 140. The imaging system 100 may represent any type of camera system that detects one or more ranges (e.g., also referred to as wavebands) of EM radiation and provides representative data (e.g., one or more still image frames or video image frames). The imaging system 100 may include a housing that at least partially encloses components of the imaging system 100, such as to facilitate compactness and protection of the imaging system 100. For example, the solid box labeled 100 in FIG. 1 may represent the housing of the imaging system 100. The housing may contain more, fewer, and/or different components of the imaging system 100 than those depicted within the solid box in FIG. 1. The imaging system 100 may include a portable device and may be implemented, for example, as a handheld device and/or coupled, in other examples, to various types of vehicles (e.g., a land-based vehicle, a watercraft, an aircraft, a spacecraft, or other vehicle) or to various types of fixed locations (e.g., a home security mount, a campsite or outdoors mount, or other location) via one or more types of mounts. In still another example, the imaging system 100 may be integrated as part of a non-mobile installation to provide image frames to be stored and/or displayed.

The imaging device 105 includes an image detector circuit 110 (e.g., a thermal IR detector circuit) and a readout circuit 115 (e.g., an ROIC). In some aspects, the image detector circuit 110 may capture (e.g., detect, sense) IR radiation with wavelengths in the range from around 700 nm to around 14 μm, or portion thereof. For example, in some aspects, the image detector circuit 110 may be sensitive to (e.g., better detect) mid-wave IR (MWIR) radiation (e.g., EM radiation with wavelength of 3-5 µm) and/or long-wave IR (LWIR) radiation (e.g., EM radiation with wavelength of 7-14 µm), or any desired IR wavelengths (e.g., generally in the 0.7 to 14 µm range). In other aspects, the image detector circuit 110 may capture radiation from one or more other wavebands of the EM spectrum, such as visible-light, ultraviolet light, and so forth.

The image detector circuit 110 may capture an image associated with a scene 145 (e.g., a real world scene). An image capturing frame rate may refer to the rate (e.g., images per second) at which images are detected in a sequence by the image detector circuit 110 and provided to the readout circuit 115. To capture the image, the image detector circuit 110 may detect image data (e.g., in the form of EM radiation) associated with the scene 145 and generate pixel values of the image based on the image data. An image may be referred to as a frame or an image frame. In some cases, the image detector circuit 110 may include an array of detectors that can detect radiation of a certain waveband, convert the detected radiation into electrical signals (e.g., voltages, currents, etc.), and generate the pixel values based on the electrical signals. In some cases, the array of detectors may be arranged in rows and columns. Each detector in the array may capture a respective portion of the scene 145 and generate a pixel value based on the respective portion captured by the detector. The pixel value generated by the detector may be referred to as an output of the detector. In an aspect, the imaging system 100 (e.g., the imaging device 105 of the imaging system 100) may include one or more optical elements (e.g., mirrors, lenses, beamsplitters, beam couplers, etc.) to direct EM radiation to the image detector circuit 110. In some cases, an optical element may be at least partially within the housing the imaging system 100.

The image may be, or may be considered, a data structure that includes pixels and is a representation of the image data, with each pixel having a pixel value that represents EM radiation emitted or reflected from a portion of the scene 145 and received by a detector that generates the pixel value. Based on context, a pixel may refer to a detector of the image detector circuit 110 that generates an associated pixel value or a pixel (e.g., pixel location, pixel coordinate) of the image formed from the generated pixel values.

In an aspect, the pixel values generated by the image detector circuit 110 may be represented in terms of digital count values generated based on the electrical signals obtained from converting the detected radiation. For example, in a case that the image detector circuit 110 includes or is otherwise coupled to an analog-to-digital converter (ADC) circuit, the ADC circuit may generate digital count values based on the electrical signals. For an ADC circuit that can represent an electrical signal using 14 bits, the digital count value may range from 0 to 16,383. In such cases, the pixel value of the detector may be the digital count value output from the ADC circuit. In other cases (e.g., in cases without an ADC circuit), the pixel value may be analog in nature with a value that is, or is indicative of, the value of the electrical signal. As an example, for infrared imaging, a larger amount of IR radiation being incident on and detected by the image detector circuit 110 (e.g., an IR image detector circuit) is associated with higher digital count values and higher temperatures.

The readout circuit 115 may be utilized as an interface between the image detector circuit 110 that detects the image data associated with the scene 145 and the processing circuit 120 that processes the detected image data as read out by the readout circuit 115. An image output frame rate may refer to the rate (e.g., images per second) at which images are provided (e.g., as output) by the readout circuit 115 (e.g., to the processing circuit 120). The readout circuit 115 may read out the pixel values generated by the image detector circuit 110 in accordance with an integration time (e.g., also referred to as an integration period). In various embodiments, a combination of the image detector circuit 110 and the readout circuit 115 may be, may include, or may together provide an FPA.

In some cases, the imaging device 105 may include one or more filters adapted to pass radiation of some wavelengths but substantially block radiation of other wavelengths. For example, the imaging device 105 may be an IR imaging device that includes one or more filters adapted to pass IR radiation of some wavelengths while substantially blocking IR radiation of other wavelengths (e.g., MWIR filters, thermal IR filters, and narrow-band filters). In this example, such filters may be utilized to tailor the imaging device 105 for increased sensitivity to a desired band of IR wavelengths. In an aspect, an IR imaging device may be referred to as a thermal imaging device when the IR imaging device is tailored for capturing thermal IR images. Other imaging devices, including IR imaging devices tailored for capturing infrared IR images outside the thermal range, may be referred to as non-thermal imaging devices.

The processing circuit 120 may perform operations to process the pixel values received (e.g., as part of frames) from the readout circuit 115. By way of non-limiting example, the processing circuit 120 may perform operations such as non-uniformity correction (NUC) (e.g., flat-field correction (FFC) or other calibration technique), spatial and/or temporal filtering, and/or radiometric conversion on the pixel values. The processing circuit 120 may be implemented as any appropriate processing device, such as a central processing unit (CPU), a graphics processing unit (GPU), a digital signal processor (DSP), a logic device, a single-core processor, a multi-core processor, a microcontroller, an application specific integrated circuit (ASIC), a programmable logic device (PLD), a field-programmable gate array (FPGA), a combination thereof, and/or other device. The processing circuit 120 may include combinations of hardware and software processing functionality and may be provided with/in and/or communicatively coupled to other components to execute appropriate instructions, such as software instructions and/or processing parameters (e.g., filtering coefficients, NUC correction terms) stored in the memory 125. In various embodiments, the processing circuit 120 may be configured to execute software instructions stored in the memory 125 to perform various methods, processes, or operations in the manner described herein. In some aspects, the readout circuit 115 and/or processing circuit 120 may include and/or may be coupled to circuitry to generate and provide timing/clock signals and/or control signals for facilitating readout of image data captured by the image detector circuit 110. As an example, such a signal may include an $F_{SYNC}$ signal associated with a start of an image. In an embodiment, the clock signals and/or other control signals may facilitate generation of signals (e.g., at an appropriate time and signal magnitude) by a signal generator to inject in a current sensing circuit.

The memory 125 may be utilized to store information for facilitating operation of the imaging system 100. The memory 125 may store information such as instructions to be executed by the various components (e.g., the readout circuit 115 and/or processing circuit 120) of the imaging system 100, parameters associated with processing operations, information associated with previously generated images (e.g., for temporal filtering), and/or other information. By way of non-limiting examples, the memory 125 may include non-volatile memory, such as read-only memory (ROM), programmable ROM (PROM), erasable programmable ROM (EPROM), electrically erasable programmable (EEPROM), flash, non-volatile random-access memory (NVRAM), etc. The memory 125 may include volatile memory, such as random-access memory (RAM), dynamic RAM (DRAM), static RAM (SRAM), etc. In some aspects, the memory 125, or a portion thereof, may be external to the imaging system 100 (e.g., an external memory accessible by the imaging system 100).

The display component 130 (e.g., screen, touchscreen, monitor) may be used to display captured and/or processed images and/or other images, data, and/or information (e.g., legend relating color in the images with temperatures). For example, the images (or a visual representation of the images) may be displayed as individual static images and/or as a series of images in a video sequence.

The control component 135 may include a control panel unit (e.g., a wired or wireless handheld control unit) having one or more user-activated mechanisms (e.g., buttons, knobs, sliders, keyboard, or others) adapted to interface with a user and receive user input (e.g., press of a button, turn of a knob, etc.). The processing circuit 120 may be adapted to sense control input signals from the control component 135 and respond to any sensed control input signals received therefrom. The one or more user-activated mechanisms of the control panel unit may be utilized to select between various modes of operation, such as to transition operation of the readout circuit 115 to burst mode operation. In addition, the control panel unit may be adapted to include one or more user-activated mechanisms to provide various other control operations of the imaging system 100, such as auto-focus, menu enable and selection, field of view (FOV), brightness, contrast, gain, offset, spatial, temporal, and/or various other features and/or parameters.

In some cases, the control component 135 may include a graphical user interface (GUI), which may be integrated as part of the display component 130 (e.g., a user actuated touchscreen) having one or more images of the user-activated mechanisms (e.g., buttons, knobs, sliders, or others), which are adapted to interface with a user and receive user input via the display component 130 (e.g., using a gesture). As an example for one or more embodiments, the display component 130 and control component 135 may represent appropriate portions of a smartphone, a tablet, a personal digital assistant, a laptop computer, a desktop computer, or other type of device.

In addition, the imaging system 100 may include other components 140. By way of non-limiting examples, the other components 140 may be used to implement any features of the imaging system 100 as may be desired for various applications, such as clocks, batteries, motion sensors, temperature sensors, one or more additional imaging devices (e.g., to capture same or different wavebands than the imaging device 105), communications components, and/or other components. As one example, motion sensors may be implemented by one or more accelerometers, gyroscopes, and/or other appropriate devices that may be used to detect movement of the imaging system 100. The information provided by the motion sensors may facilitate image processing operations (e.g., spatial filtering, temporal filtering) performed by the processing circuit 120, such as by facilitating differentiation between motion in the scene relative to motion of the imaging system 100. As another example, temperature sensors may be utilized to perform one or more temperature readings of the imaging system 100, such as to determine whether one or more portions of the imaging system 100 are operating properly (e.g., not overheating). As another example, communications components may facilitate wired and/or wireless communication between components within the imaging system 100 and/or between the imaging system 100 and other systems. Examples of communications components may include components (e.g., interfaces, connections) for facilitating communication using Universal Serial Bus (USB), Ethernet, WiFi, Bluetooth, cellular, infrared, radio, and/or other wired or wireless protocols.

Figure 2:
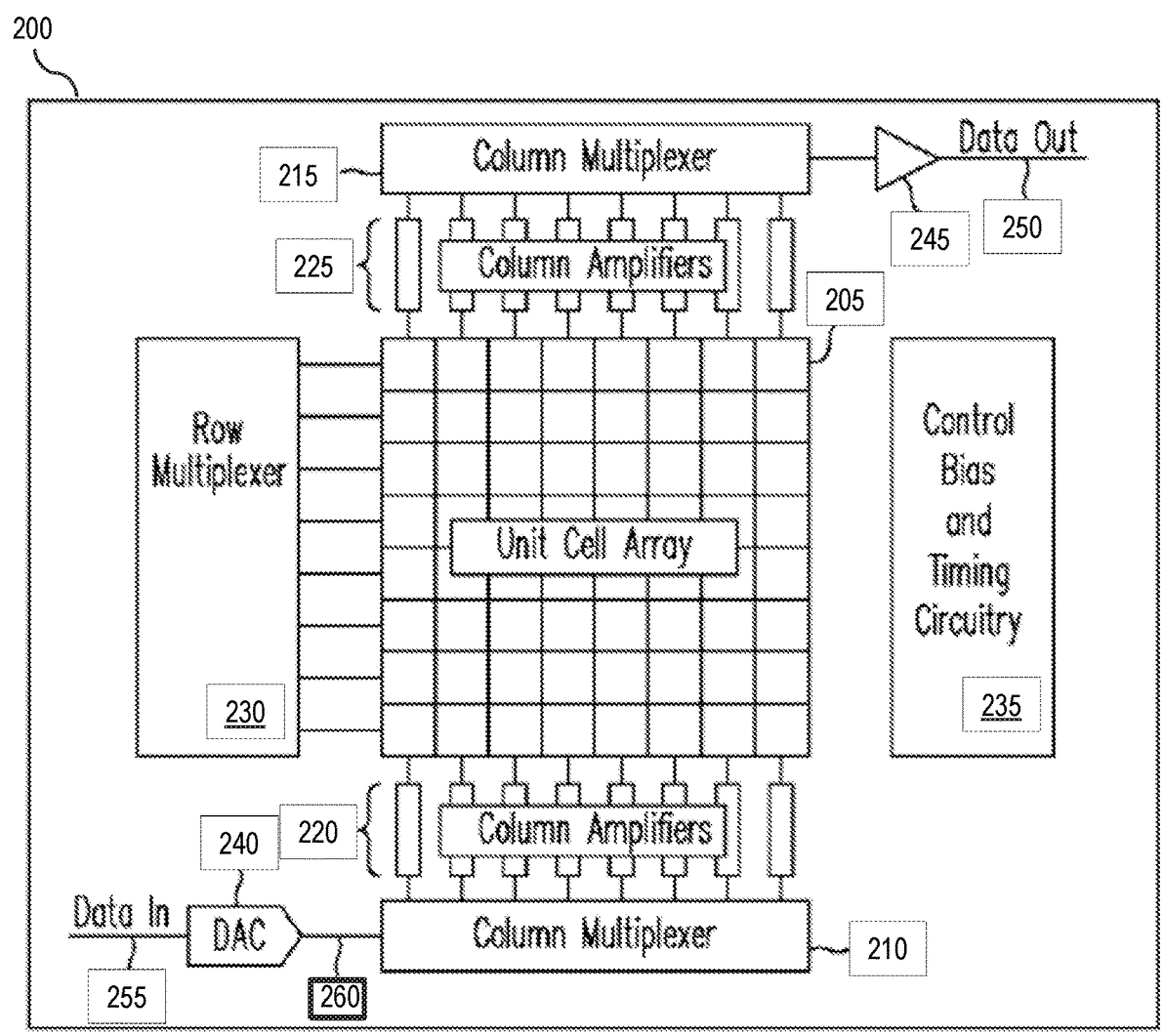
FIG. 2 illustrates a block diagram of an example focal plane array in accordance with one or more embodiments of the present disclosure.

FIG. 2 illustrates a block diagram of an example FPA 200 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the FPA 200 may include, may be a part of, and/or may be collectively provided by the image detector circuit 110 and readout circuit 115.

The FPA 200 includes a unit cell array 205, column multiplexers 210 and 215, column amplifiers 220 and 225, a row multiplexer 230, control bias and timing circuitry 235, a digital-to-analog converter (DAC) 240, and a data output buffer 245. The unit cell array 205 includes an array of unit cells. In an aspect, each unit cell may include a detector and an interface circuitry. The interface circuitry of each unit cell may provide an output signal, such as an output voltage or current, in response to a detection signal (e.g., detector current, detector voltage) provided by the detector of the unit cell. The output signal may be indicative of the magnitude of EM radiation received by the detector. The column multiplexer 215, column amplifiers 220, row multiplexer 230, and data output buffer 245 may be used to provide the output signals from the unit cell array 205 as a data output signal on a data output line 250. The output signals on the data output line 250 may be provided to components downstream of the FPA 200, such as processing circuitry (e.g., the processing circuit 120), memory (e.g., the memory 125), display device (e.g., the display component 130), and/or other component. The data output signal may be an image formed of the pixel values for the FPA 200. In this regard, the column multiplexer 215, column amplifiers 220, row multiplexer 230, and data output buffer 245 may collectively provide an ROIC (or portion thereof) of the FPA 200.

In an aspect, the column amplifiers 225 may generally represent any column processing circuitry as appropriate for a given application (analog and/or digital), and is not limited to amplifier circuitry for analog signals. In this regard, the column amplifiers 225 may more generally be referred to as column processors in such an aspect. Signals received by the column amplifiers 225, such as analog signals on an analog bus and/or digital signals on a digital bus, may be processed according to the analog or digital nature of the signal. As an example, the column amplifiers 225 may include circuitry for processing digital signals. As another example, the column amplifiers 225 may be a path (e.g., no processing) through which digital signals from the unit cell array traverses to get to the column multiplexer 215. As another example, the column amplifiers 225 may include an ADC for converting analog signals to digital signals. These digital signals may be provided to the column multiplexer 215.

Each unit cell may receive a bias signal (e.g., bias voltage, bias current) to bias the detector of the unit cell to compensate for different response characteristics of the unit cell attributable to, for example, variations in temperature, manufacturing variances, and/or other factors. For example, the control bias and timing circuitry 235 may generate the bias signals and provide them to the unit cells. By providing appropriate bias signals to each unit cell, the unit cell array 205 may be effectively calibrated to provide accurate image data in response to light (e.g., IR light) incident on the detectors of the unit cells.

The control bias and timing circuitry 235 may generate bias values, timing control voltages, and switch control voltages. In some cases, the DAC 240 may convert the bias values received as, or as part of, data input signal on a data input signal line 255 into bias signals (e.g., analog signals on analog signal line(s) 260) that may be provided to individual unit cells through the operation of the column multiplexer 210, column amplifiers 220, and row multiplexer 230. In another aspect, the control bias and timing circuitry 235 may generate the bias signals (e.g., analog signals) and provide the bias signals to the unit cells without utilizing the DAC 240. In this regard, some implementations do not include the DAC 240, data input signal line 255, and/or analog signal line(s) 260. In an embodiment, the control bias and timing circuitry 235 may be, may include, may be a part of, or may otherwise be coupled to the readout circuit 115 and/or processing circuit 120 of FIG. 1. In an embodiment, the control bias and timing circuitry 235 may generate clock signals and/or other control signals to facilitate generation of signals (e.g., appropriate time and signal magnitude) by a signal generator to inject in a current sensing circuit.

In an aspect, the FPA 200 may be implemented as part of an imaging system (e.g., the imaging system 100). In addition to the various components of the FPA 200, the imaging system may also include one or more processors, memories, logic, displays, interfaces, lenses, and/or other components as may be appropriate in various implementations. In an aspect, the data output signal on the data output line 250 may be provided to the processors (not shown) for further processing. For example, the data output signal may be an image formed of the pixel values from the unit cells of the FPA 200. The processors may perform operations such as NUC, spatial and/or temporal filtering, and/or other operations. The images (e.g., processed images) may be stored in memory (e.g., external to or local to the imaging system) and/or displayed on a display device (e.g., external to and/or integrated with the imaging system).

By way of non-limiting examples, the unit cell array 205 may include 512×512 (e.g., 512 rows and 512 columns of unit cells), 1024×1024, 2048×2048, 4096×4096, 8192× 8192, and/or other array sizes. In some cases, the array size may have a row size (e.g., number of detectors in a row) different from a column size (e.g., number of detectors in a column). Examples of frame rates may include 30 Hz, 60 Hz, and 120 Hz.

Figure 3:
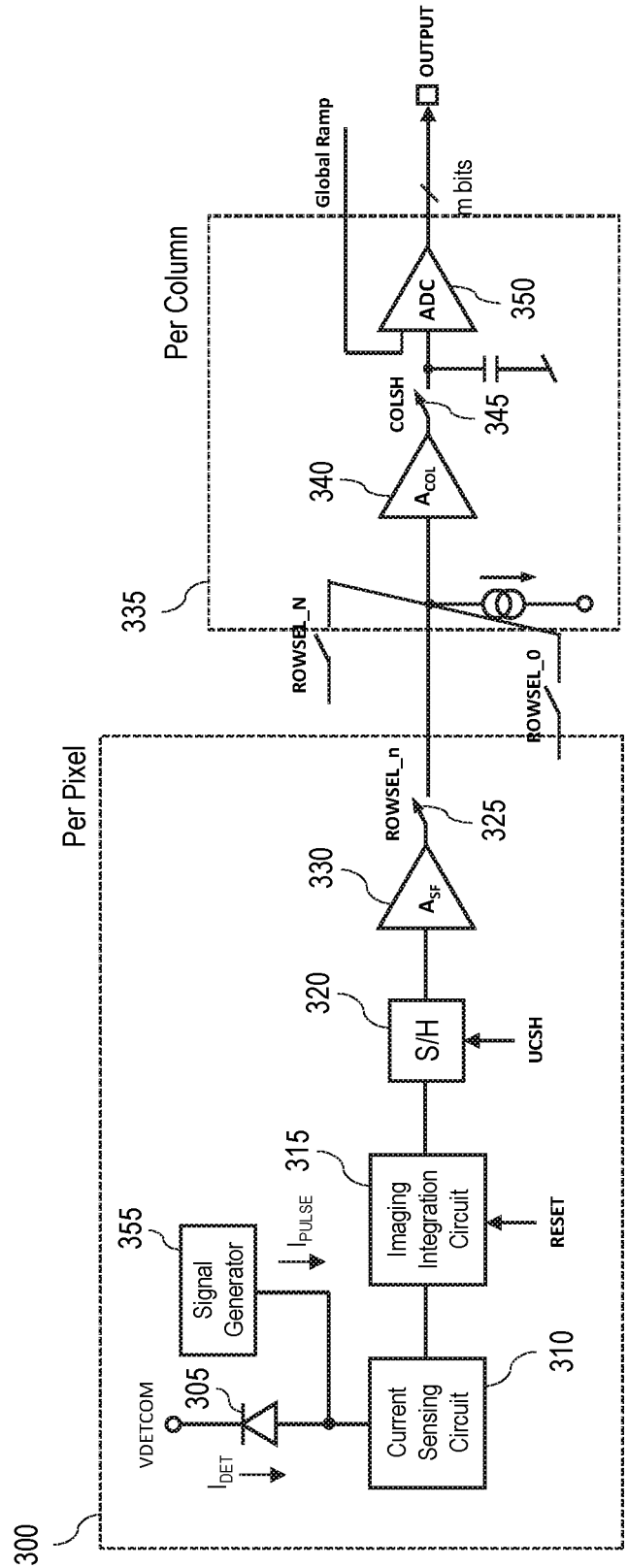
FIG. 3 illustrates an example unit cell and an associated per-column readout circuit in accordance with one or more embodiments of the present disclosure.

FIG. 3 illustrates an example unit cell 300 and an associated per-column readout circuit 335 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the unit cell 300 may be, may include, or may be a part of, a unit cell of the unit cell array 205.

The unit cell 300 includes a detector 305, a current sensing circuit 310, and an imaging integration circuit 315. The detector 305 is connected to a detector voltage supply, denoted as $V_{DETCOM}$, and the current sensing circuit 310. The detector 305 may generate a detector current $I_{DET}$ based on captured image data (e.g., in the form of EM radiation) and provide the detector current $I_{DET}$ to the current sensing circuit 310. In an aspect, the image data may be from a portion of a scene being imaged by an imaging system (e.g., 100) that includes the unit cell 300. By way of non-limiting example, the detector 305 may be a photodetector, such as an avalanche photodiode, an infrared photodetector, a quantum well infrared photodetector, a microbolometer, or other detector capable of converting EM radiation (e.g., of a certain wavelength) to the detector current $I_{DET}$. A magnitude of the detector current $I_{DET}$ is generally proportional to a magnitude of the EM radiation captured by the detector 305. The current sensing circuit 310 may generate signals (e.g., voltages, currents) based on the detector current $I_{DET}$ and provide the signals to the imaging integration circuit 315. In an aspect, the current sensing circuit 310 may include a transistor that can be closed to pass/inject the detector current $I_{DET}$ to the imaging integration circuit 315. The current sensing circuit 310 may be utilized as an input circuit that interfaces with the detector 305 and the imaging integration circuit 315. In this regard, the current sensing circuit 310 may be referred to as an input circuit.

During an integration period, the imaging integration circuit 315 may generate an integration voltage by integrating (e.g., using an integration capacitor of the imaging integration circuit 315) signals that it receives from the current sensing circuit 310. In this regard, the integration voltage is indicative of the image data (e.g., portion of a scene) captured by the detector 305. In an aspect, the portion of the scene captured by the detector 305 of the unit cell 300 may be referred to as an image or an image portion. At an end of the integration period, the imaging integration circuit 315 may provide the integration voltage to a sample and hold (S/H) circuit 320 to allow the S/H circuit 320 to sample and hold the integration voltage. The S/H circuit 320 may hold the integration voltage until a switch 325 is closed. In an aspect, the S/H circuits 320 may be controlled by a control signal UCSH. For example, the switch 325 may be closed when a row of the unit cell array (e.g., 205 in FIG. 2) that includes the unit cell 300 is being read out. In this example, the switch 325 may be referred to as a row-select switch.

In an aspect, once the integration voltage has been read out or sampled, the integration voltage may be cleared from the imaging integration circuit 315 using a reset circuit prior to a next integration period to facilitate a next integration operation of the imaging integration circuit 315. In FIG. 3, a control signal RESET may be provided to clear the imaging integration circuit 315. The reset circuit may include appropriate switches to cause a reset of the imaging integration circuit 315 (e.g., reset a voltage across an integration capacitor of the imaging integration circuit 315 to zero). For example, the control signal RESET may be in an asserted state (e.g., logic high) to cause the switches to close (e.g., to reset the integration capacitor) and a deasserted state (e.g., logic low) to cause the switches to open (e.g., to allow integration). In some cases, the imaging integration circuit 315 and/or the S/H circuit 320 may include a reset circuit (or portion thereof).

A buffer 330 may be utilized to isolate the integration voltage that is output from the imaging integration circuit 315 (e.g., as held by the S/H circuit 320) until the switch 325 is closed to allow readout of the integration voltage. In this regard, the buffer 330 may isolate the S/H circuit 320 from circuitry that follow the buffer 330 (e.g., per-column readout components to the right of the buffer 330 in FIG. 3). As an example, the buffer 330 may be, or may include, an analog voltage buffer with a source follower topology.

During readout of the unit cell 300, the switch 325 is closed (e.g., by asserting a row select control signal ROWSEL_n) to connect the unit cell 300 to the per-column readout circuit 335. Other rows have their respective row-select switches, which are controlled by corresponding row select control signals ROWSEL_0 through ROWSEL_N in FIG. 3. For example, N may be 511 for a case with 512 rows (e.g., $0^{th}$ row to $511^{th}$ row). The integration voltage may be read out from the buffer 330 and isolated by a column buffer 340. The column buffer 340 may isolate the integration voltage until a switch 345 closes, signifying a time for the integration voltage to be converted to a digital signal by an ADC 350. In some cases, the ADC 350 may be a comparator that compares the integration voltage with one or more thresholds to determine a digital representation (e.g., m-bit representation) of the integration voltage. As an example, the ADC 350 may generate a 14 bit output based on the integration voltage. In other cases, the digital representation of the integration voltage may be more or fewer than 14 bits. The ADC 350 may provide the digital representation of the integration voltage for the unit cell 300. The ADC 350 provides an output of the unit cell 300 (indicative of image data captured by the unit cell 300) to one or more appropriate components for storage, display, and/or processing.

In one or more embodiments, a bandwidth (and equivalently a recovery time) associated with the current sensing circuit 310 (e.g., a direct injection (DI) circuit) for the detector 305 may be a function of the detector current $I_{DET}$. A signal generator 355 is provided to generate a current $I_{PULSE}$ to adjust the bandwidth associated with the current sensing circuit 310. In some aspects, the current $I_{PULSE}$ may be provided to the current sensing circuit 310 to mitigate effects of a large amplitude, short duration current generated by the detector 305. Such a large amplitude, short duration current signal may be referred to as a current event. In one case, the current event may be due to a return pulse. The bandwidth of the current sensing circuit 310 is inversely related to the recovery time associated with the current sensing circuit 310, such that higher bandwidth is associated with shorter recovery time and lower bandwidth is associated with longer recovery time. The recovery time may be, may be indicative of, and/or may also be referred to as a response time associated with the current sensing circuit 310 to return the current sensing circuit 310 to its desired operating condition (e.g., operating condition absent effects of the current event generated by the detector 305). In an embodiment, as an example, the recovery time is a time for the detector current $I_{DET}$ to settle to within 0.1% of an expected value of the detector current $I_{DET}$ in absence of the current event (e.g., in absence of a pulse return). In other embodiments, a different detector current threshold may be utilized for determining the recovery time.

Without the current $I_{PULSE}$ provided by the signal generator 355, for a duration that the current event is received by the signal generator 355 from the detector 305, a bandwidth of the current sensing circuit 310 may increase quickly as a function of the increased detector current $I_{DET}$ generated by the detector 305 and thus transition the current sensing circuit 310 to a higher bandwidth state that can meet a recovery time criterion (e.g., 1 μs or other desired recovery time criterion). When the duration ends, the bandwidth of the current sensing circuit 310 may decrease quickly as a function of the reduced current level of the detector current $I_{DET}$ generated by the detector 305 and thus transition the current sensing circuit 310 to a lower bandwidth state that may be insufficient to allow recovery (e.g., full recovery) within the recovery time criterion. In this regard, in the lower bandwidth state, the response time to return the current sensing circuit 310 to its desired operating condition may exceed the recovery time criterion.

In an aspect, the current event does not have a predictable magnitude, and a time to recover to a nominal operating condition while in the lower bandwidth state may be variable and lengthy compared to a collection/integration time. By applying (e.g., injecting) the current $I_{PULSE}$, the signal generator 355 mitigates an effect of the current event on the bandwidth of the current sensing circuit 310 to facilitate meeting of a recovery time criterion for the unit cell 300. The current $I_{PULSE}$ may increase the bandwidth associated with the current sensing circuit 310 to allow a shorter recovery time. In this regard, the current $I_{PULSE}$ may facilitate control of the bandwidth of the detector 305 and improve recovery time in a more controlled (e.g., more predictable a priori) manner. For instance, a decay associated with the current event may be more controlled by applying the current $I_{PULSE}$. The current $I_{PULSE}$ may be considered a signal injected into the current sensing circuit 310 by the signal generator 355. In FIG. 3, the current $I_{PULSE}$ is provided in parallel with the detector current $I_{DET}$ such that the current sensing circuit 310 receives a current $I_{DET}+I_{PULSE}$. As an example, the signal generator 355 may facilitate meeting of a recovery time criterion at a minimum integration delay time of 1 μs.

In FIG. 3, the signal generator 355 is provided as part of the unit cell 300. In one aspect, a signal generator may be provided on a per-pixel basis such that each unit cell of the unit cell array may have a signal generator. In another aspect, one or more signal generators may be provided separate from the unit cells, with each signal generator providing a respective current $I_{PULSE}$ to one or more of the unit cells. The signal generator(s) may be provided to inject a signal into a current sensing circuit of each unit cell to control the bandwidth of the current sensing circuit and effectuate a recovery time that achieves recovery time criteria of each unit cell.

Using various embodiments, injection of the current $I_{PULSE}$ (e.g., or, equivalently, injection of a corresponding amount of charge) may allow removal of an offset that varies with previous input pulses from the scene. In this regard, as large inputs from the scene arrive, the bandwidth associated with the current sensing circuit 310 increases and thus those inputs can be quickly removed. Small to medium inputs from the scene collect charge on an input detector node, but may not substantially change the bandwidth. Thus, a longer duration of time may be needed to move charge corresponding to these small to medium pulses from the detector node to an integration node. By adding (e.g., injecting) the extra current (e.g., $I_{PULSE}$) or extra charge using the signal generator 355, a uniform and repeatable (e.g., large, uniform and repeatable) pulse is added to every pixel, so that all pixels see the same pulse and increase in bandwidth. The extra current or extra charge thus facilitates removal of the charge from previous pulses, including mid-range scene pulse inputs. In an aspect, since the bandwidth increases for the extra signal (e.g., current or charge) added, the extra signal is generally removed (e.g., substantially completely removed) by the time integration starts. If an offset exists when integration starts, the offset is generally small and the same on all pixels as well as repeatable.

Figure 4:
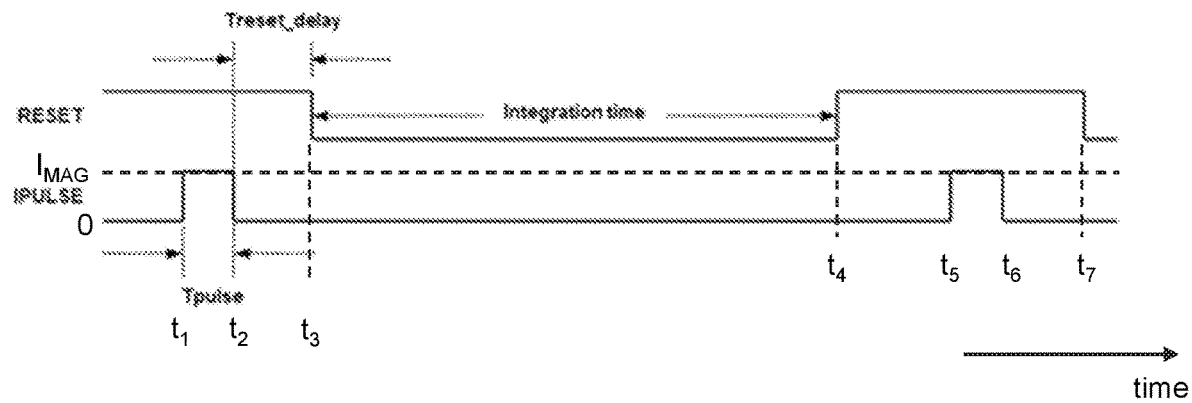
FIG. 4 illustrates an example timing diagram associated with a reset control signal RESET for defining an integration time of the unit cell of FIG. 3 and a current $I_{PULSE}$ provided by a signal generator associated with the unit cell in accordance with one or more embodiments of the present disclosure.

FIG. 4 illustrates an example timing diagram 400 associated with a reset control signal RESET for defining an integration time of the unit cell 300 and the current $I_{PULSE}$ provided by the signal generator 355 in accordance with one or more embodiments of the present disclosure. In some aspects, as shown in the timing diagram 400, each instance of the current $I_{PULSE}$ is provided as a pulsed current signal and provided outside of an integration time of the unit cell 300 to minimize or avoid an effect of the current $I_{PULSE}$ on an integrated signal of the unit cell 300. Such a pulsed approach to providing the current $I_{PULSE}$ is in contrast to a case in which the current $I_{PULSE}$ is provided as a quiescent source. As a quiescent source (not shown), the current $I_{PULSE}$ is integrated in addition to the detector current INET and adds noise associated with the additional integrated charge.

The control signal RESET may be in an asserted state (e.g., logic high) to clear the imaging integration circuit 315 and maintain the imaging integration circuit 315 in the reset state (e.g., also referred to as a cleared state). The control signal RESET may be in a deasserted state (e.g., logic low) during an integration period to allow generation of an integration voltage indicative of image data (e.g., of the scene 145) captured by the detector 305. In FIG. 4, the control signal RESET is in an asserted state at a time t<$t_3$ and $t_4$<t<$t_7$, and in a deasserted state at a time $t_3$<t<$t_4$ and t>$t_7$. Durations outside of the integration period may be referred to as a reset period/time, integration reset period/time, or blanking period/time. The current $I_{PULSE}$=$I_{MAG}$ at a time $t_1$<t<$t_2$ and $t_5$<t<$t_6$, and $I_{PULSE}$=0 at other times. In this regard, the current signal $I_{PULSE}$ is enabled during a reset period so as not to impact an integrated signal. A magnitude $I_{MAG}$ of the current $I_{PULSE}$ may be set to cause a change in the bandwidth of the current sensing circuit 310 to allow recovery within a minimum integration delay time.

Electrical pulse characteristics associated with the current $I_{PULSE}$ may be controlled and applied as appropriate to mitigate effects of current events generated by the detector 305, such as changes in bandwidth of the current sensing circuit 310 due to the current events. In an aspect, a post-pulse response may be controlled and not dependent on an occurrence of a current event produced by the detector 305 or its magnitude. Examples of electrical pulse characteristics include a pulse width $T_{PULSE}$, a magnitude $I_{MAG}$ of the current $I_{PULSE}$, and a holdoff time $T_{reset\_delay}$. The pulse width $T_{PULSE}$ is a width (e.g., time duration) of the current $I_{PULSE}$ provided by the signal generator 355. The holdoff time $T_{reset\_delay}$ is a time duration from an end of the current $I_{PULSE}$ to a beginning of the integration time (e.g., $T_{reset\_delay}$=$t_3$−$t_2$). The recovery time is inversely dependent on the magnitude $I_{MAG}$ (e.g., larger magnitude $I_{MAG}$ is associated with decreased recovery time). In an aspect, the holdoff time $T_{reset\_delay}$ may be set to be longer than the recovery time to minimize or eliminate an impact of an applied current $I_{PULSE}$ on an integrated signal. Injection of the current $I_{PULSE}$ may essentially correspond to injection of a charge in the amount of $I_{PULSE}T_{PULSE}$, where $T_{PULSE}$ is the time the pulse is on. In some cases, the current $I_{PULSE}$ may be enabled (e.g., applied) when the detector 305 is expected to produce an undesired current event. In an aspect, the control bias and timing circuitry 235 of FIG. 2 (and/or other control circuitry) may generate control signals and/or clock signals that set the electrical pulse characteristics and/or the times at which the current $I_{PULSE}$ is applied (e.g., times when $I_{PULSE}$=$I_{MAG}$). In an aspect, each instance of an integration period is preceded by a pulse of the current $I_{PULSE}$ having a magnitude $I_{MAG}$. One or more of the electrical pulse characteristics can be adjusted as appropriate to facilitate meeting of recovery time criteria. It is noted that signal amplitudes and time durations utilized to facilitate meeting of recovery time criteria are generally application dependent.

Figure 5:
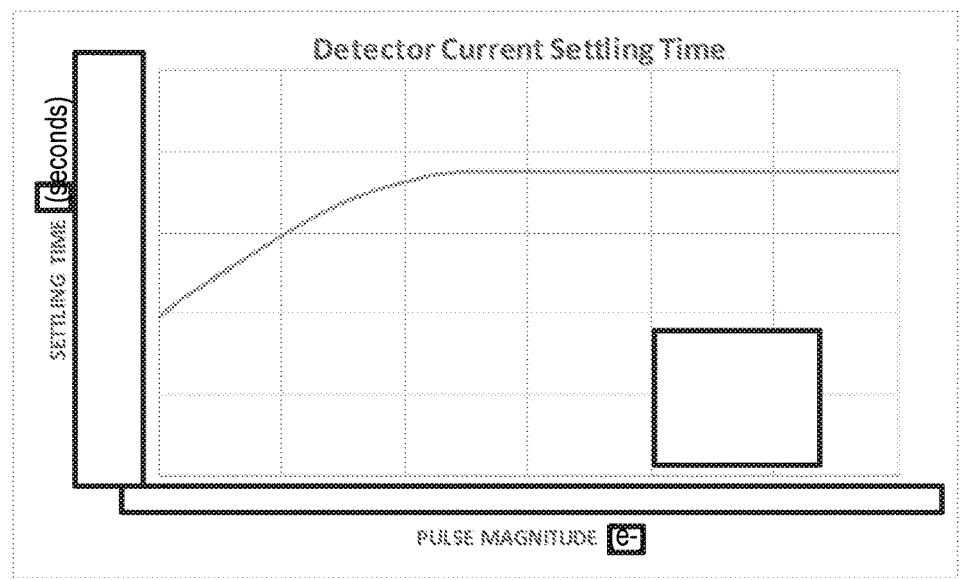
FIG. 5 illustrates an example of a detector current settling time after a pulsed event in a case that a signal generator applies a current to a current sensing circuit in accordance with one or more embodiments of the present disclosure.

FIG. 5 illustrates an example of a detector current settling time after a pulsed event in a case that the current $I_{PULSE}$ from the signal generator 355 is applied to the current sensing circuit 310 (e.g., DI input circuit) in accordance with one or more embodiments of the present disclosure. The pulse event may be a recovered photon flux from a laser. For instance, photons arriving during a reset period may be associated with a current $I_{PH}$. The pulse event causes the detector 305 to generate a high amplitude, short duration current. The horizontal axis is provided in units of electrons from a scene pulse and is the size of the scene input pulse that occurs prior to the signal generator 355 being enabled. The vertical axis is the time in seconds to settle the detector node (e.g., the time taken for the detector node to recover to a point as if no pulse had occurred after the signal generator 355 is turned off). As shown generally by the curve, independent of the size of the scene pulse (e.g., different current $I_{PH}$), the increase in bandwidth from signal generator 355 settles the detector node within a certain timeframe after the signal generator 355 is turned off, which is when integration may then start. Without the signal generator 355 to inject a signal, a longer amount of time may be needed before the detector node settles to the same value (relative to the case with an injection of a signal) for various scene inputs on the horizontal axis. For example, in some cases, a maximum recovery time value in the graph may represent an improvement of orders of magnitude over the case where a recovery pulse is not used (e.g., not injected).

Figure 6:
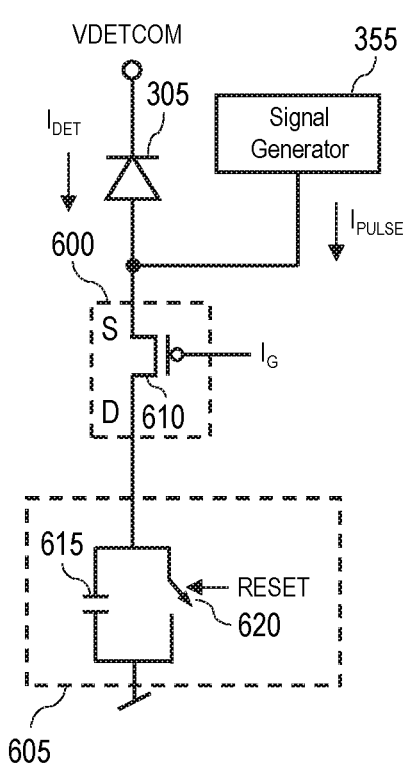
FIGS. 6 and 7 illustrate example current sensing circuits and associated circuitry in accordance with one or more embodiments of the present disclosure.

FIG. 6 illustrates an example current sensing circuit 600 and associated circuitry in accordance with one or more embodiments of the present disclosure. The current sensing circuit 600 includes a transistor 610. In an aspect, the current sensing circuit 600 may be referred to as a direct injection circuit. A bias signal (e.g., a bias voltage $I_G$) may be applied to the transistor 610 (e.g., a gate of the transistor 610) and may allow the transistor 610 to provide the detector current INET to an imaging integration circuit 605 by direct injection during an integration period. In an aspect, the bias signal may be provided by the control bias and timing circuitry 235 of FIG. 2. A source of the current sensing circuit 600 is coupled to the detector 305 and the signal generator 355. A drain of the current sensing circuit 600 is coupled to an imaging integration circuit 605 that includes an integration capacitor 615 and a switch 620. In an embodiment, the current sensing circuit 600 and the imaging integration circuit 605 may be, may include, or may be a part of the current sensing circuit 310 and the imaging integration circuit 315, respectively, of FIG. 3. In an aspect, the transistor 610 may be, or may be referred to as, a direct injection metal-oxide-semiconductor field effect transistor (MOSFET).

During an integration period, the transistor 610 may be biased to pass the detection current $I_{DET}$ to the integration capacitor 615 (e.g., the current $I_{PULSE}$=0 during the integration period), and the integration capacitor 615 may integrate the received current. At an end of the integration period, the integration capacitor 615 may provide a resulting integration voltage as output. In an aspect, the integration voltage may be sampled and held by the S/H circuit 320 of FIG. 3 for subsequent readout. A switch of the S/H circuit 320 may be closed (e.g., in an on state) at the end of the integration period to allow the integration voltage from the integration capacitor 615 to be sampled onto a capacitor of the S/H circuit 320 and held by the capacitor of the S/H circuit 320. After the integration voltage is sampled and held, the reset switch 620 may close to short out the integration capacitor 615 to reset the integration capacitor 615 to facilitate a next integration period. The reset switch 620 may be controlled (e.g., turned on or off) by asserting (e.g., set to logic high) or deasserting (e.g., set to logic low) a reset control signal RESET. An example of a state (e.g., asserted, deasserted) of the control signal RESET as a function of time is shown in the timing diagram 400 of FIG. 4.

A sum of the detector current $I_{DET}$ and the current $I_{PULSE}$ may be provided to the transistor 610. As shown with respect to the timing diagram 400 of FIG. 4, the current $I_{PULSE}=I_{MAG}$ at a time $t_1<t<t_2$ and $t_5<t<t_6$ and $I_{PULSE}=0$ at other times. The signal generator 355 may generate the current $I_{PULSE}$ having appropriate pulse characteristics to increase (e.g., temporarily increase for the duration around $t_1<t<t_2$ and $t_5<t<t_6$) a bandwidth associated with the current sensing circuit 600, such as to mitigate a current event generated by the detector 305.

Figure 7:
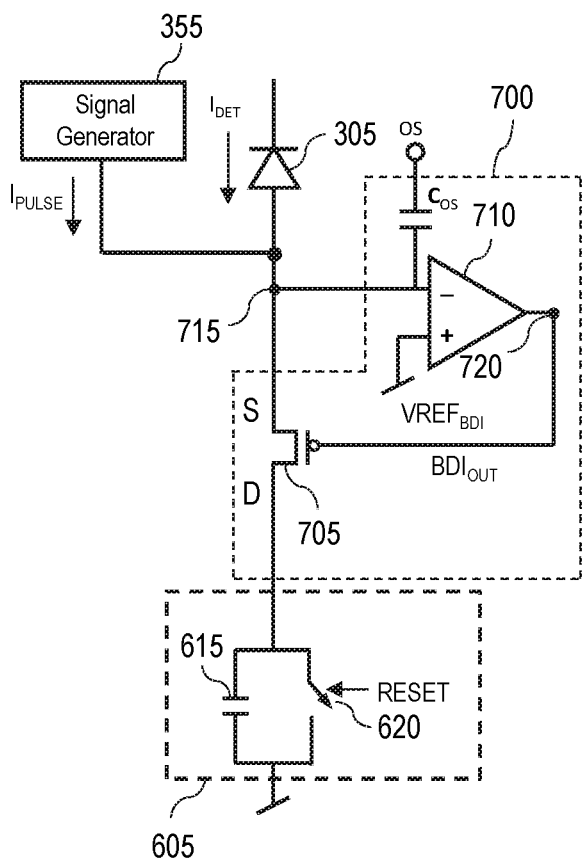

FIG. 7 illustrates another example current sensing circuit 700 and associated circuitry in accordance with one or more embodiments of the present disclosure. The description from FIG. 6 generally applies to FIG. 7, with examples of differences and other description provided herein. The current sensing circuit 700 includes a transistor 705 and a buffer circuit 710. In an aspect, the current sensing circuit 700 may be referred to as a buffered direct injection (BDI) circuit or a feedback enhanced direction injection (FEDI) circuit. An input node of the buffer circuit 710 may be directly connected to a node 715. In some cases, the buffer circuit 710 may include a transistor, with the input node of the current sensing circuit 700 being a gate of the transistor. The buffer circuit 710 generates an output voltage $BDI_{OUT}$ at its output node 720 based on the detector current $I_{DET}$ and the current $I_{PULSE}$ received at its input node. The output voltage $BDI_{OUT}$ may be used to drive a gate of the transistor 705. A source of the transistor 705 may be tied to the node 715 and a drain of the transistor 705 may be tied to the imaging integration circuit 605. In this regard, the node 715 is connected to the detector 305, the signal generator 355, and the current sensing circuit 700. In an aspect, the transistor 705 may be, or may be referred to as, a direct injection MOSFET.

During an integration period, the output voltage $BDI_{OUT}$ drives the gate of the transistor 705 and causes the transistor 705 to be biased, such that the detector current $I_{DET}$ is provided to the integration capacitor 615 (e.g., the current $I_{PULSE}=0$ during the integration period). The integration capacitor 615 may integrate the received current. At an end of the integration period, the integration capacitor 615 may provide a resulting integration voltage as output. In an aspect, the integration voltage may be sampled and held by the S/H circuit 320 of FIG. 3 for subsequent readout. The reset switch 620 may then be closed to allow reset of the integration capacitor 615. An example of a state (e.g., asserted, deasserted) of the control signal RESET as a function of time is shown in the timing diagram 400 of FIG. 4.

A sum of the detector current $I_{DET}$ and the current $I_{PULSE}$ may be provided to the transistor 705 and the buffer circuit 710. As shown with respect to the timing diagram 400 of FIG. 4, the current $I_{PULSE}=I_{MAG}$ at a time $t_1<t<t_2$ and $t_5<t<t_6$ and $I_{PULSE}=0$ at other times. The signal generator 355 may generate the current $I_{PULSE}$ having appropriate pulse characteristics to increase (e.g., temporarily increase for the duration around $t_1<t<t_2$ and $t_5<t<t_6$) a bandwidth associated with the current sensing circuit 700, such as to mitigate a current event generated by the detector 305.

Figures 8, 9:
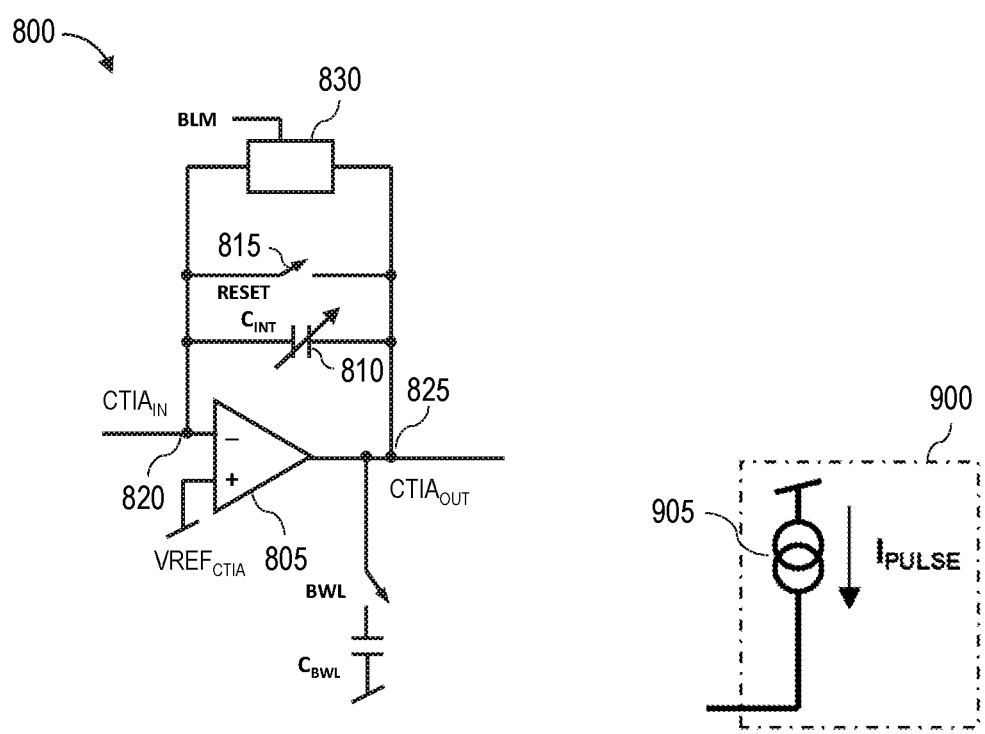
FIG. 8 illustrates an example imaging integration circuit in accordance with one or more embodiments of the present disclosure.
FIG. 9 illustrates an example signal generator in accordance with one or more embodiments of the present disclosure.

Although FIGS. 6 and 7 illustrate examples in which the imaging integration circuit 605 includes the integration capacitor 615 and the reset switch 620, an imaging integration circuit may include additional components. FIG. 8 illustrates an example imaging integration circuit 800 in accordance with one or more embodiments of the present disclosure. As an example, the imaging integration circuit 800 may be employed in place of the imaging integration circuit 605 of FIGS. 6 and 7. The imaging integration circuit 800 may be referred to as a capacitive transimpedance amplifier (CTIA) circuit.

The imaging integration circuit 800 includes an amplifier 805, an integration capacitor 810 (e.g., also used for feedback and referred to as a feedback capacitor), and a reset switch 815. The integration capacitor 810 is coupled between an input node 820 and an output node 825 of the imaging integration circuit 800. In an embodiment, the imaging integration circuit 800 may receive (e.g., via direct injection) the detector current $I_{DET}$ and the current $I_{PULSE}$ from a current sensing circuit (e.g., 600, 700). In an aspect, with respect to FIG. 6, the input node 820 of the imaging integration circuit 800 may be coupled to the drain of the transistor 610 of the current sensing circuit 600 and may receive the detector current $I_{DET}$ and the current $I_{PULSE}$. In another aspect, with respect to FIG. 7, the input node 820 of the imaging integration circuit 800 may be coupled to the drain of the transistor 705 of the current sensing circuit 700 and may receive the detector current $I_{DET}$ and the current $I_{PULSE}$. The output node 825 of the imaging integration circuit 800 may be coupled to the S/H circuit 320. In some cases, the imaging integration circuit 800 includes anti-blooming circuitry 830. Anti-blooming parameters may be provided by a control signal BLM. During an integration period, the reset switch 815 is open (e.g., in an off state) and the integration capacitor 810 integrates a voltage across the integration capacitor 810. At an end of the integration period, an integration voltage across the integration capacitor 810 may be sampled and held (e.g., by the S/H circuit 320). A switch of the S/H circuit 320 may be closed (e.g., in an on state) at the end of the integration period to allow the integration voltage from the integration capacitor 810 to be sampled onto a capacitor of the S/H circuit 320 and held by the capacitor of the S/H circuit 320. After the integration voltage is sampled and held, the reset switch 815 may close to short out the integration capacitor 810 to reset the integration capacitor 810 (e.g., set the integration voltage to zero through discharge of the integration capacitor 810) to facilitate a next integration period. The reset switch 815 may be controlled (e.g., turned on or off) by asserting (e.g., set to logic high) or deasserting (e.g., set to logic low) the control signal RESET. An example of a state (e.g., asserted, deasserted) of the control signal RESET as a function of time is shown in the timing diagram 400 of FIG. 4.

FIG. 9 illustrates an example signal generator 900 in accordance with one or more embodiments of the present disclosure. The signal generator 900 includes a current source 905 that generates the current $I_{PULSE}$. In an aspect, the signal generator 900 may be, may include, or may be a part of the signal generator 355. In one case, with respect to FIG. 6, the current source 905 may be connected to the detector 305 and the transistor 610. In another case, with respect to FIG. 7, the current source 905 may be connected to the detector 305, the transistor 705, and the buffer circuit 710.

Although FIGS. 3-9 illustrate an example in which the signal generator 355 may generate the current pulse $I_{PULSE}$ and provide in parallel with the detector 305, in other embodiments, the signal generator 355 may direct optical and/or thermal signals (e.g., laser light, IR radiation, or radiation of another portion of the EM spectrum) to the detector 305 to cause the detector 305 to generate a higher detector current $I_{DET}$ relative to a case in which a stimulus from the signal generator 355 is not provided to the detector 305. In this regard, such a stimulus may cause the detector current to be $I_{DET}I_{PULSE}$, where $I_{DET}$ is the detector current in the absence of the external signal and $I_{PULSE}$ is the component contributed by the response of the detector 305 to the stimulus. More generally, the signal generator 355 may provide any signal appropriate to cause a current sensing circuit (e.g., an input circuit) to receive a signal $I_{DET}+I_{PULSE}$. For optical and/or thermal signals applied to the detector 305, the signal generator 355 may be placed in a sensing path and may be compatible with sensing characteristics of the detector 305 (e.g., spectral bandwidth). For example, the signal generator 355 may include a light source (e.g., mid-wave infrared light emitting diode) that transmits an optical stimulus within an optical path associated with the detector 305. Furthermore, although the foregoing describes a case in which the detector 305 generates a current signal $I_{DET}$ as its detection signal, in other embodiments, the detector 305 may generate other types of detection signals (e.g., voltage signal, optical signal, or other signals). A current event may more generally be referred to as a pulse event generated by the detector 305. The signal generator 355 may generate a detector signal of an appropriate type to allow combining with the detector signal to mitigate effects of pulse events generated by the detector 305.

Although the foregoing is primarily described in relation to injecting current (e.g., injecting a current $I_{PULSE}$), the injected current corresponds to an amount of injected charge. In this regard, injecting a current $I_{PULSE}$ for a time $T_{PULSE}$ corresponds essentially to injecting charge in the amount of $I_{PULSE}T_{PULSE}$. Besides generating a current for a given time, charge may be injected into the current sensing circuit by charging up a capacitor of the unit cell in some embodiments, as described below.

Figure 10:
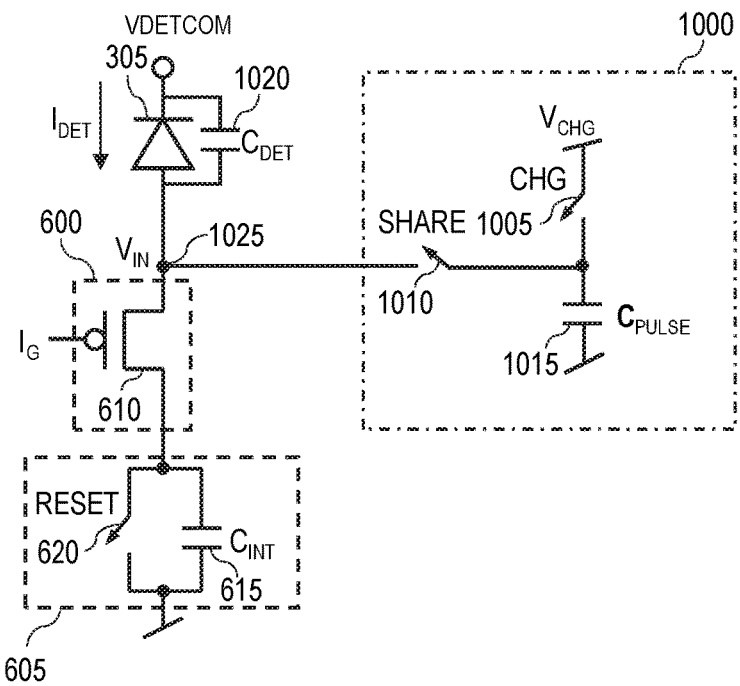
FIG. 10 illustrates an example signal generator and associated circuitry in accordance with one or more embodiments of the present disclosure.
Figure 11:
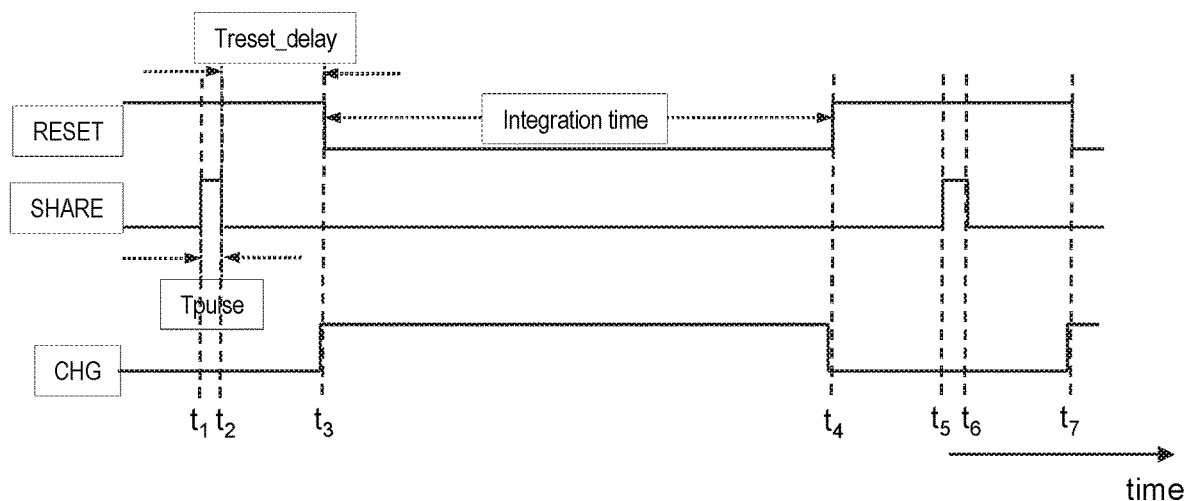
FIG. 11 illustrates an example timing diagram associated with selective applying of a signal by a signal generator to a current sensing circuit, in accordance with one or more embodiments of the present disclosure.

FIG. 10 illustrates an example signal generator 1000 and associated circuitry in accordance with one or more embodiments of the present disclosure. The signal generator 1000 may selectively apply (e.g., inject) a signal to the current sensing circuit 600. FIG. 11 illustrates an example timing diagram 1100 associated with the selective applying of a signal by the signal generator 1000 to the current sensing circuit 600, in accordance with one or more embodiments of the present disclosure. The signal generator 1000 includes a switch 1005 (denoted as CHG), a switch 1010 (denoted as SHARE), and a capacitor 1015 (denoted as $C_{PULSE}$). A source of the current sensing circuit 600 is coupled to the detector 305 and the signal generator 1000. A detector node of the detector 305 has a capacitor 1020, denoted as $C_{DET}$, formed of a capacitance associated with the detector 305 and a parasitic capacitance in the ROIC. The capacitor 1020 may have a given amount of charge on it that is based on a detector bias. In some cases, the charge may be provided by $C_{DET}(V_{DETCOM}-V_{IN})$, where $V_{IN}$ is a voltage at a node 1025 that connects to an other side of the detector 305 as well as the source of the transistor 610. The node 1025 is connected to the detector 305, the signal generator 1000, and the current sensing circuit 600.

With reference to FIG. 11, a signal $T_{PULSE}$ is applied to the switch 1010 such that the switch 1010 is closed during $T_{PULSE}$. As such, during $T_{PULSE}$, the capacitors 1015 and 1020 are connected such that charge is shared between the capacitors 1015 and 1020. In this regard, charge is transferred from the capacitor 1015 to the capacitor 1020, thus adding additional charge to the node 1025 (e.g., the input node of the current sensing circuit 600). A control signal RESET may be in an asserted state (e.g., logic high) to clear the imaging integration circuit 605 and maintain the imaging integration circuit 605 in the reset state (e.g., also referred to as a cleared state). The control signal RESET may be in a deasserted state (e.g., logic low) during an integration period to allow generation of an integration voltage indicative of image data (e.g., of the scene 145) captured by the detector 305. In FIG. 11, the control signal RESET is in an asserted state at a time $t<t_3$ and $t_4<t<t_7$, and in a deasserted state at a time $t_3<t<t_4$ and $t>t_7$. In an aspect, the switches 1005 and 1010 are non-overlapping, such that the switch 1005 is closed when the switch 1010 is open and vice versa. A signal CHG can be asserted at the same time as the RESET signal, as long as CHG and SHARE are non-overlapping (e.g., CHG is in a logic high state when SHARE is in a logic low state, and vice versa). When the switch 1005 is closed and the switch 1010 is open, the capacitor 1015 can be charged using a bias $V_{CHG}$ (e.g., a bias voltage provided by a power supply), such that the charge on the capacitor 1015 can be shared with the capacitor 1020 when the switch 1005 is open and the switch 1010 is closed. In some cases, the bias may be a voltage appropriate to charge up the capacitor 1015 to allow a desired amount of charge to be injected into the current sensing circuit 600. The current sensing circuit 600 may uniformly increase bandwidth associated with the current sensing circuit 600 each time the extra charge is applied on (e.g., injected into) the current sensing circuit 600 at the node 1025, with the extra charge being the same and repeatable each time.

Figure 12:
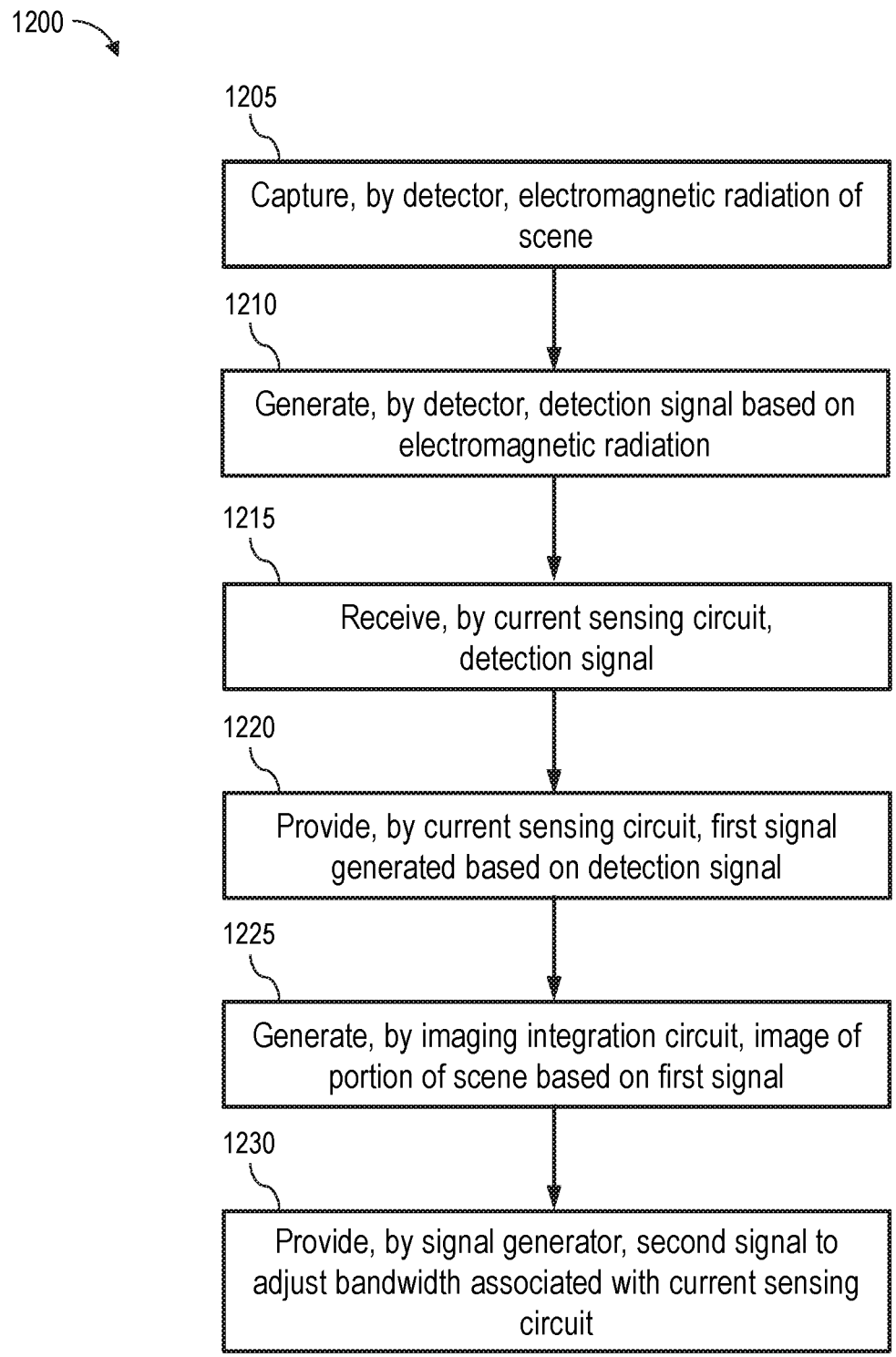
FIG. 12 illustrates a flow diagram of an example process for facilitating current sensing recovery in accordance with one or more embodiments of the present disclosure.

FIG. 12 illustrates a flow diagram of an example process 1200 for facilitating current sensing recovery in accordance with one or more embodiments of the present disclosure. For explanatory purposes, the example process 1200 is primarily described herein with reference to the unit cell 300 of FIG. 3; however, the example process 1200 is not limited to the unit cell 300 of FIG. 3. The blocks of example process 1200 are described herein as occurring in serial, or linearly (e.g., one after another). However, multiple blocks of example process 1200 may occur in parallel. In addition, the blocks of example process 1200 need not be performed in the order shown and/or one or more of the blocks of example process 1200 need not be performed.

At block 1205, the detector 305 captures EM radiation associated with the scene 145 of FIG. 1. At block 1210, the detector 305 generates a detection signal based on the EM radiation. The detection signal may be a detector current INET. At block 1215, the current sensing circuit 310 receives the detection signal from the detector 305. At block 1220, the current sensing circuit 310 provides, to the imaging integration circuit 315, a signal generated based on the detection signal. For example, the current sensing circuit 310 may include a direct injection circuit or a buffered injection circuit. The injection circuit may include a transistor (e.g., the transistor 610 of FIG. 6) that is biased to allow the detection signal to pass the transistor and be injected into the imaging integration circuit 315. At block 1225, the imaging integration circuit 315 generates an image of at least a portion of the scene 145 based on the signal from the current sensing circuit 310. At block 1230, the signal generator 355 provides a signal to adjust a bandwidth associated with the current sensing circuit 310. The signal from the signal generator 355 may mitigate effects of a large amplitude, short duration detection signal generated by the detector 305. The signal generator 355 may inject its signal in the current sensing circuit 310 during reset periods associated with the unit cell 300 (e.g., outside of integration periods associated with the unit cell 300). The injected signal may be a current signal (e.g., pulsed current signal, such as in FIGS. 6 and 7) or a charge (e.g., FIG. 10).

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The foregoing description is not intended to limit the present disclosure to the precise forms or particular fields of use disclosed. Embodiments described above illustrate but do not limit the invention. It is contemplated that various alternate embodiments and/or modifications to the present invention, whether explicitly described or implied herein, are possible in light of the disclosure. Accordingly, the scope of the invention is defined only by the following claims.

What is claimed is:

1. A device, comprising:
a detector configured to detect electromagnetic radiation and generate a detection signal based on the detected electromagnetic radiation;
a current sensing circuit configured to provide, based on the detection signal, a first signal;
a signal generator configured to provide a second signal to adjust a bandwidth associated with the current sensing circuit; and
an imaging integration circuit configured to generate an image of at least a portion of a scene based at least in part on the first signal.

2. The device of claim 1, wherein the signal generator is configured to provide the second signal as a pulse signal during a reset period associated with the imaging integration circuit.

3. The device of claim 1, wherein the detection signal is a first current signal and the second signal is a pulsed current signal, and wherein the current sensing circuit is configured to receive the first current signal and the pulsed current signal.

4. The device of claim 1, wherein the second signal is a laser light applied to the detector.

5. The device of claim 1, wherein the second signal is infrared radiation applied to the detector.

6. The device of claim 1, wherein the signal generator comprises a capacitor, and wherein the capacitor is selectively coupled to the detector and is configured to provide the second signal when the capacitor is coupled to the detector.

7. The device of claim 6, wherein the signal generator further comprises a first switch, and wherein the first switch is configured to selectively couple the capacitor of the signal generator to a capacitor associated with the detector.

8. The device of claim 7, wherein the capacitor of the signal generator is configured to transfer charge to the capacitor associated with the detector when the first switch couples the capacitor of the signal generator to the capacitor associated with the detector, and wherein the second signal is based on the charge.

9. The device of claim 7, wherein the signal generator further comprises a second switch connected to the capacitor and the first switch, and wherein the second switch is configured to selectively couple a bias voltage to the capacitor.

10. The device of claim 9, wherein the first switch and the second switch are in opposite states.

11. The device of claim 1, wherein the current sensing circuit comprises a direct injection (DI) circuit, and wherein the DI circuit comprises a transistor coupled to the detector, the signal generator, and the imaging integration circuit.

12. The device of claim 1, wherein the current sensing circuit comprises a buffered direct injection (BDI) circuit, wherein the BDI circuit comprises:
a transistor coupled to the detector, the signal generator, and the imaging integration circuit; and
a buffer circuit coupled to the detector, the imaging integration circuit, and the transistor.

13. The device of claim 1, wherein the imaging integration circuit comprises:
a switch connected to the current sensing circuit; and
an integration capacitor connected to the switch and the current sensing circuit.

14. The device of claim 1, wherein the imaging integration circuit comprises a capacitive transimpedance amplifier (CTIA) circuit.

15. The device of claim 1, wherein the device is a unit cell of a focal plane array, and wherein the imaging integration circuit is configured to provide the image for read out.

16. A method, comprising:
capturing, by a detector, electromagnetic radiation;
generating, by the detector, a detection signal based on the electromagnetic radiation;
providing, by a current sensing circuit, a first signal based on the detection signal;
generating, by an imaging integration circuit, an image of at least a portion of a scene based at least in part on the first signal; and
providing, by a signal generator, a second signal to adjust a bandwidth associated with the current sensing circuit.

17. The method of claim 16, wherein the signal generator provides the second signal during a portion of a reset period associated with the imaging integration circuit.

18. The method of claim 16, wherein the detection signal is a first current signal and the second signal is a pulsed current signal, and wherein the current sensing circuit receives the first current signal and the pulsed current signal.

19. The method of claim 16, wherein the signal generator comprises a capacitor, the method further comprising:
   selectively coupling the capacitor to the detector,
      wherein the capacitor provides the second signal to the current sensing circuit when the capacitor is coupled to the detector.

20. The method of claim 19, wherein the providing the second signal comprises transferring charge from the capacitor of the signal generator to a capacitor associated with the detector, and wherein the second signal is based on the charge.

21. The method of claim 19, further comprising:
   selectively coupling the capacitor to a bias voltage; and
   charging the capacitor using the bias voltage when the capacitor is coupled to the power supply.

* * * * *

UNITED STATES PATENT AND TRADEMARK OFFICE
CERTIFICATE OF CORRECTION

PATENT NO. : 11,092,625 B2  Page 1 of 1
APPLICATION NO. : 16/679042
DATED : August 17, 2021
INVENTOR(S) : John D. Schlesselmann and Brian B. Simolon It is certified that error appears in the above-identified patent and that said Letters Patent is hereby corrected as shown below:

In the Specification

In the Detailed Description:

In Column 3, Line 6, change "INET" to -- $I_{DET}$ --.

In Column 13, Line 18, change "INET" to -- $I_{DET}$ --.

In Column 14, Line 45, change "INET" to -- $I_{DET}$ --.

In Column 18, Line 58, change "INET" to -- $I_{DET}$ --.

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*